(12) United States Patent
Yang et al.

(10) Patent No.: US 7,615,863 B2
(45) Date of Patent: Nov. 10, 2009

(54) MULTI-DIMENSIONAL WAFER-LEVEL INTEGRATED ANTENNA SENSOR MICRO PACKAGING

(75) Inventors: Jeffrey Ming-Jer Yang, Cerritos, CA (US); Yun-Ho Chung, Redondo Beach, CA (US); Patty Chang-Chien, Redondo Beach, CA (US)

(73) Assignee: Northrop Grumman Space & Missions Systems Corp., Los Angeles, CA (US)

( * ) Notice: Subject to any disclaimer, the term of this patent is extended or adjusted under 35 U.S.C. 154(b) by 170 days.

(21) Appl. No.: 11/581,851

(22) Filed: Oct. 16, 2006

(65) Prior Publication Data

US 2007/0290326 A1 Dec. 20, 2007

Related U.S. Application Data

(60) Provisional application No. 60/814,758, filed on Jun. 19, 2006.

(51) Int. Cl.
*H01L 23/34* (2006.01)
(52) U.S. Cl. ............... 257/728; 257/181; 257/484; 257/275
(58) Field of Classification Search ........... 257/686, 257/678, 728, 275, 691, 710, 730; 343/872
See application file for complete search history.

(56) References Cited

U.S. PATENT DOCUMENTS 5,404,581 A 4/1995 Honjo
5,541,614 A * 7/1996 Lam et al. ............... 343/792.5
6,653,668 B2 * 11/2003 Higuchi et al. ............ 257/192
6,953,985 B2 * 10/2005 Lin et al. .................. 257/659
7,067,397 B1 6/2006 Chang-Chien et al.
7,238,999 B2 * 7/2007 LaFond et al. ............ 257/417
7,285,442 B2 * 10/2007 Moden et al. ............. 438/107
2002/0179921 A1 12/2002 Cohn
2003/0230798 A1 * 12/2003 Lin et al. .................. 257/704
2004/0178473 A1 9/2004 Dentry et al.
2005/0023656 A1 2/2005 Leedy

FOREIGN PATENT DOCUMENTS

JP 2004 172245 A 6/2004

* cited by examiner

*Primary Examiner*—Jasmine J Clark
(74) *Attorney, Agent, or Firm*—John A. Miller; Miller IP Group, PLC

(57) ABSTRACT

An integrated packaging assembly for an MMIC that uses the semiconductor wafers on which circuit elements are fabricated as the package. The packaging assembly includes a plurality of semiconductor layers that have been diced from the semiconductor wafers, where the semiconductor layers can be made of different semiconductor material. The semiconductor layers define cavities therebetween in which circuit components are fabricated. A sealing ring seals the semiconductor layers together so as to hermetically seal the circuit components within the cavities.

22 Claims, 5 Drawing Sheets

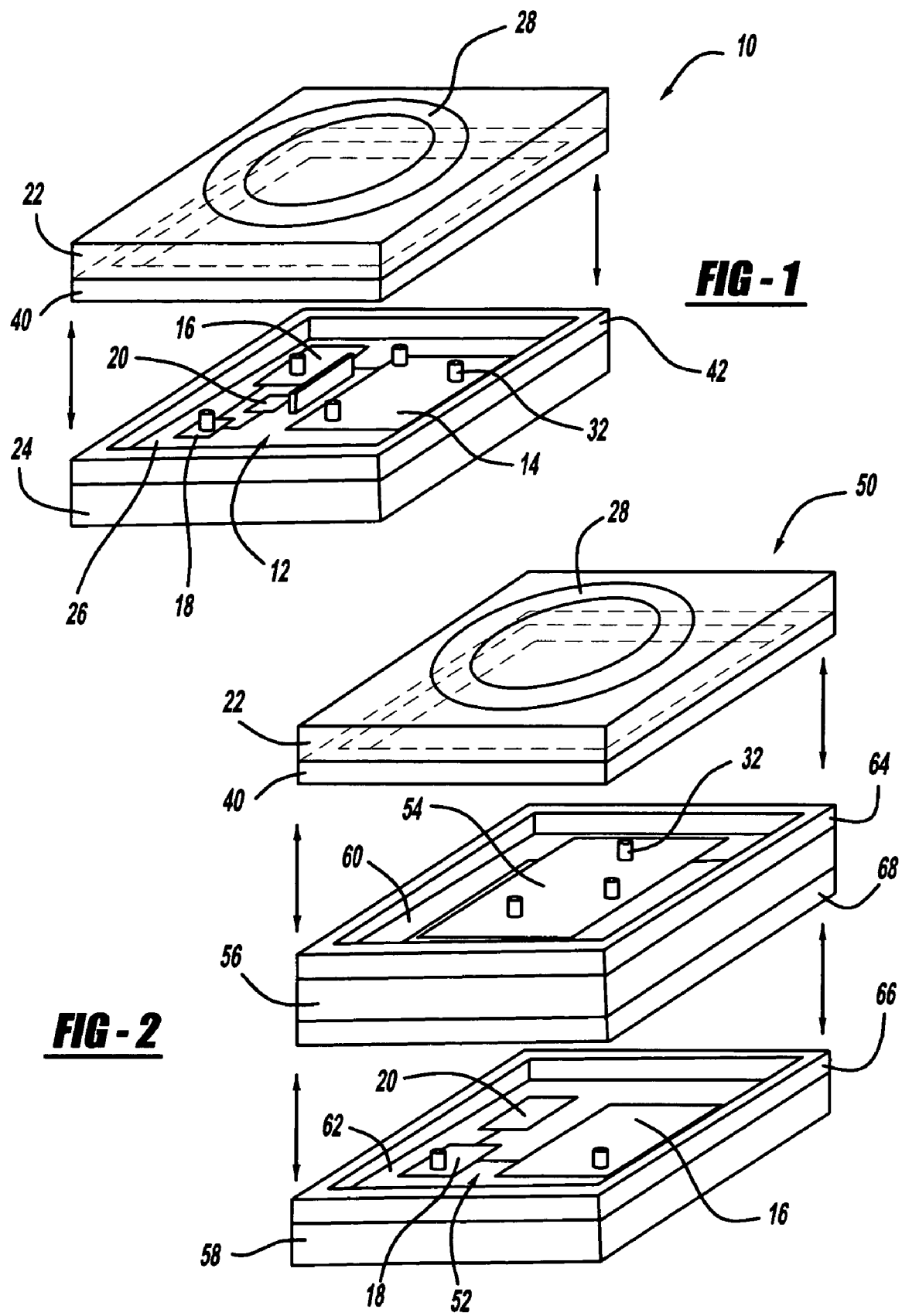

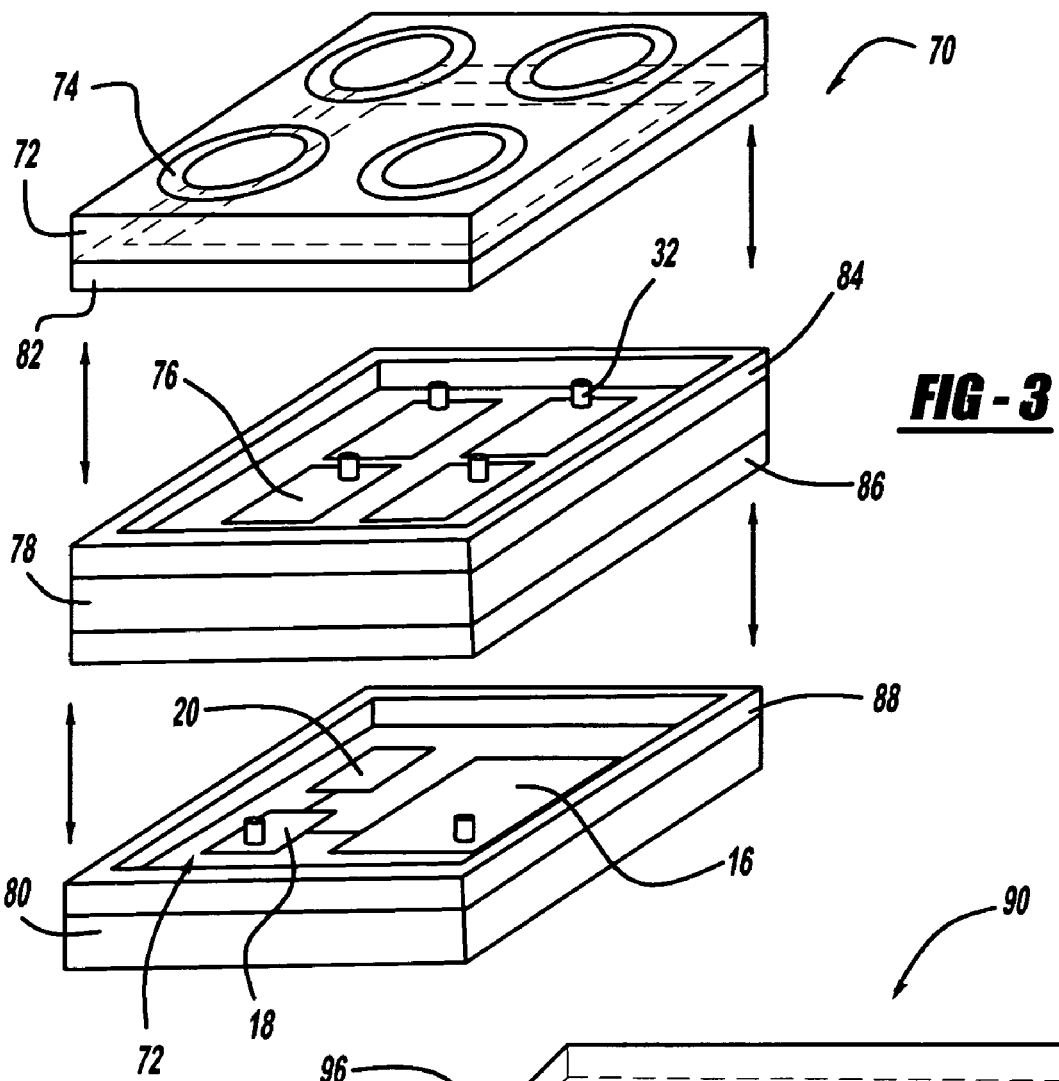
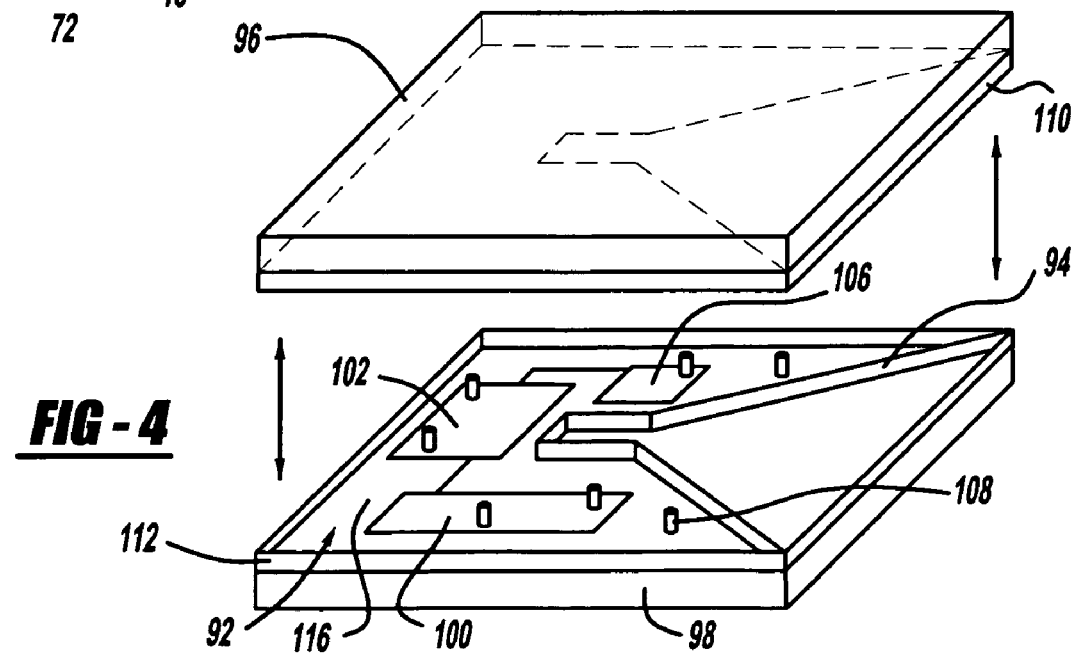

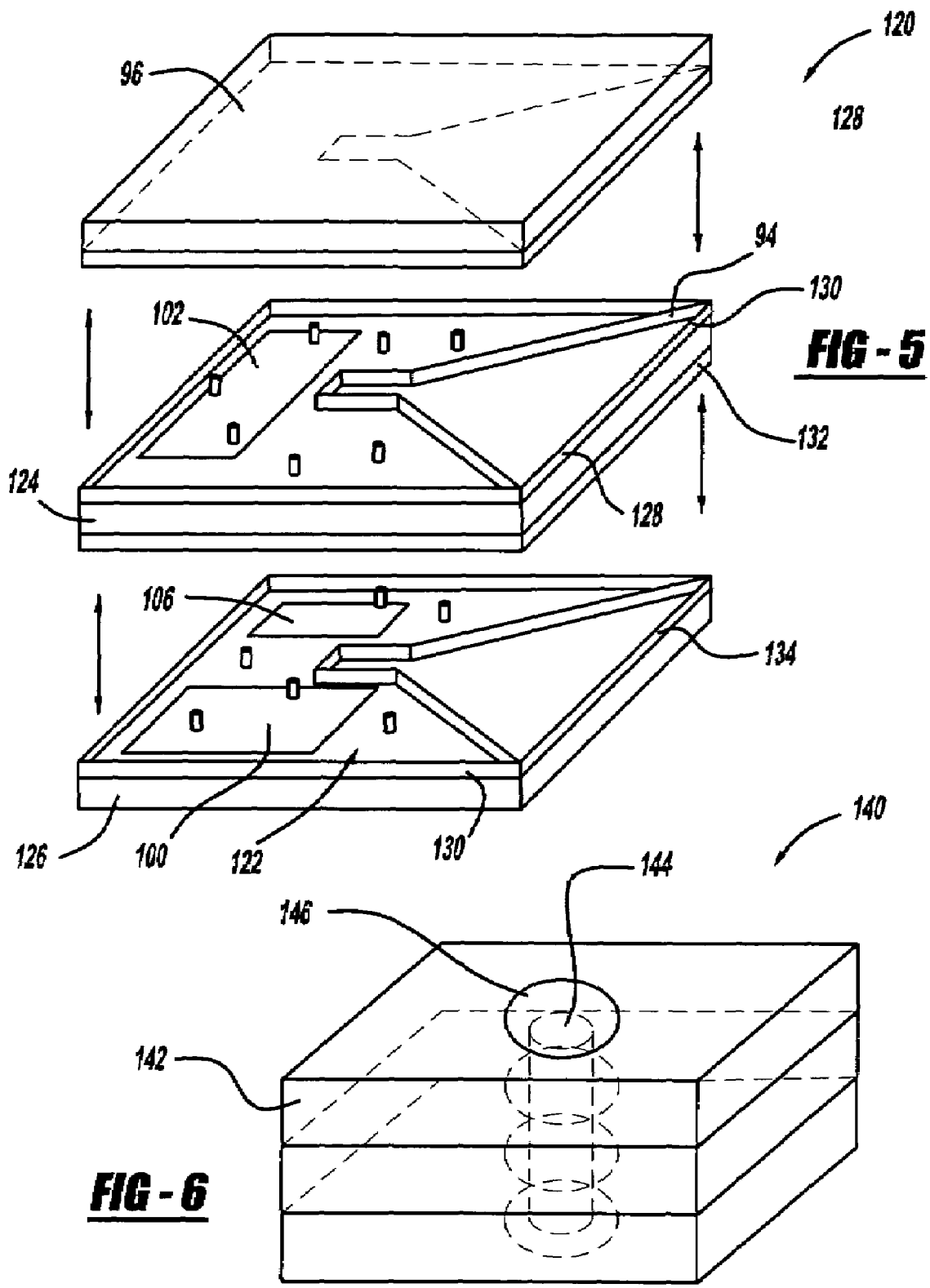

MULTI-DIMENSIONAL WAFER-LEVEL INTEGRATED ANTENNA SENSOR MICRO PACKAGING

CROSS-REFERENCE TO RELATED APPLICATIONS

This application claims the benefit of the priority date of U.S. Provisional Patent Application No. 60/814,758, titled Multi-Dimensional Wafer-Level Integrated Antenna Sensor Micro Packaging, filed Jun. 19, 2006.

BACKGROUND OF THE INVENTION

1. Field of the Invention

This invention relates generally to an integrated packaging assembly for a monolithic microwave integrated circuit (MMIC) and, more particularly, to an integrated packaging assembly for a MMIC that uses diced semiconductor wafers on which the circuit components are fabricated as the packaging so as to reduce size, weight and cost.

2. Discussion of the Related Art

In actual operating conditions, MMICs are typically enclosed in a sealed packaging assembly. Chip scale packaging is a known technique for environmentally protecting and configuring an electronic chip device and associated circuits within the packaging assembly. A ball grid array (BGA) is one known packaging design that provides an interface to the circuit within the packaging assembly through an array of solder balls mounted to a backside of a base plate of the packaging assembly. The solder balls are electrically coupled to the electronic device and associated circuits within the packaging assembly by electrical vias that extend through a base plate of the assembly. A BGA offers compact size, shortened connector lengths necessary for reducing parasitic capacitances and inductances, and good thermal contact to the packaging assembly for heat sink purposes.

One known application for a packaged MMIC is an antenna front-end circuit for a transceiver associated with a radar system, such as a phased antenna array radar system. A typical antenna front-end circuit that will be mounted in the packaging assembly includes power amplifiers for the transmitted signals, low noise amplifiers (LNAs) for the received signals, phase shifters and digital controllers. For a phased antenna array application, the antenna associated with the transceiver circuit must have a certain scan angle, such as 60°, that determines the dimensions of the packaging assembly in terms of the operating wavelength. As the frequency of the system increases, the element to element spacing and the corresponding antennas size need to be reduced to maintain the same scan performance.

The known packaging material for these types of circuits, such as the BGA discussed above, typically are a ceramic material or like material that enclose the circuit components. The ceramic material adds a significant amount of weight and size to the packaging assembly. A typical BGA packaging assembly for the application discussed above may be on the order of 4 grams, which dominates the overall weight of the array system. In addition, the physical size of the BGA package, limited by mechanical tolerances, yields additional performance constraints, such as reduced scan angle.

SUMMARY OF THE INVENTION

In accordance with the teachings of the present invention, an integrated packaging assembly for an MMIC is disclosed that uses the semiconductor wafers on which circuit elements are fabricated as the package. The packaging assembly includes a plurality of semiconductor layers that have been diced from the semiconductor wafers, where the semiconductor layers can be made of different semiconductor materials. The semiconductor layers define cavities therebetween in which circuit components are fabricated. A sealing ring seals the semiconductor layers together so as to hermetically seal the circuit components within the cavities. In one embodiment, the circuit is a transceiver circuit including an antenna deposited on an outside surface of one of the semiconductor layers, where the circuit provides about a 60° scan angle.

Additional features of the present invention will become apparent from the following description and appended claims, taken in conjunction with the accompanying drawings.

BRIEF DESCRIPTION OF THE DRAWINGS

FIG. 1 is a blown-apart perspective view of an integrated packaging assembly for an MMIC transceiver circuit, where the dimensions of the largest element in the circuit is much less than half the wavelength of the frequency band of interest, according to an embodiment of the present invention;

FIG. 2 is a blown-apart perspective view of an integrated packaging assembly for an MMIC transceiver circuit, where the dimensions of the largest element in the circuit is slightly less than half the wavelength of the frequency band of interest, according to an embodiment of the present invention;

FIG. 3 is a blown-apart perspective view of an integrated packaging assembly for an MMIC transceiver circuit, where the dimensions of the largest element in the circuit is about half the wavelength of the frequency band of interest, according to another embodiment of the present invention;

FIG. 4 is a blown-apart perspective view of an integrated packaging assembly for an MMIC transceiver circuit, where the dimensions of the largest element in the circuit is slightly less than half the wavelength of the frequency band of interest, according to another embodiment of the present invention;

FIG. 5 is a blown-apart perspective view of an integrated packaging assembly for an MMIC transceiver circuit, where the dimensions of the largest element in the circuit is about half the wavelength of the frequency band of interest, according to another embodiment of the present invention;

FIG. 6 is a perspective view of an array of stacked packaging assemblies of the type shown in FIG. 5;

DETAILED DESCRIPTION OF THE EMBODIMENTS

Figure 7:
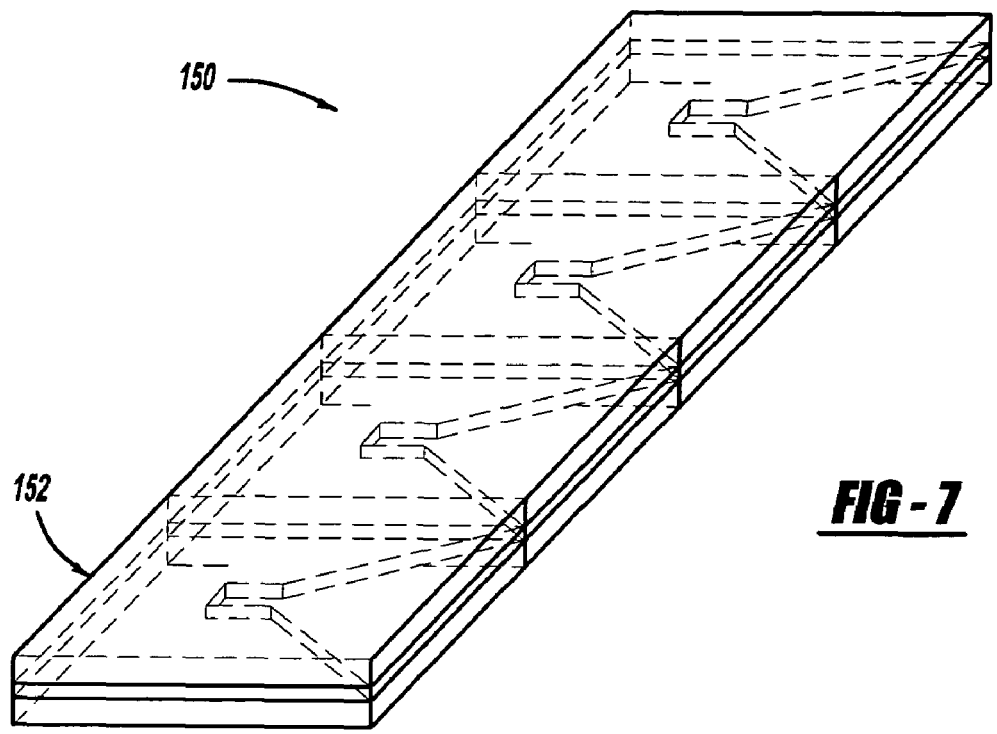
FIG. 7 is a perspective view of an array of side-by-side packaging assemblies of the type shown in FIG. 4.

The following discussion of the embodiments of the invention directed to an integrated packaging assembly for an MMIC is merely exemplary in nature, and is in no way intended to limit the invention or its applications or uses. For example, the packaging assembly discussed below has particular application for the antenna front-end of a transceiver circuit in a phased antenna array radar system. However, as will be appreciated by those skilled in the art, the packaging assembly and techniques of the present invention will have a much wider application for other types of integrated circuits.

As will be discussed in detail below, the present invention proposes a fully integrated MMIC, such as an antenna front-end, that leverages wafer level packaging to the optimal technology per function through bonding of multiple III-V semiconductor materials, such as gallium arsenide and indium phoside, and silicon wafers. The wafer level packaging of the invention forms hermetically sealed cavities that allow the integration of active transistors, both RF and digital, micro-electrical-mechanical systems (MEMS), low loss filters and radiating elements in an ultra compact, low mass package. The batch fabrication techniques used to provide the packaging yields extremely low cost integrated antenna front-end assemblies. The packaging assembly is formed right after dicing of the semiconductor wafer, where manufacturing steps required for conventional module integration are eliminated. The resulting module can be used for large-scale integration, such as array configurations or single lightweight man-portable/unmanned vehicle systems.

FIG. 1 is a blown-apart perspective view of an integrated packaging assembly 10 for an MMIC transceiver circuit 12 including a plurality of integrated circuit components, such as power amplifiers, low noise amplifiers (LNAs), phase shifters and digital controllers. For example, the transceiver circuit 12 may include amplifiers 14, phase shifters 16, a digital controller 18 and switches 20. The packaging assembly 10 includes an upper semiconductor layer 22 and a lower semiconductor layer 24 defining a cavity 26 therein. The semiconductor layers 22 and 24 are diced semiconductor wafers on which the various circuit components of the circuit 12 are fabricated. A ring patch antenna 28 is formed from a metallized layer deposited on a top surface of the layer 22. A plurality of circuit interconnects 32 connect the various circuit components in the cavity 26 with other circuit components formed in a cavity (not shown) at the underside of the layer 22. The short length of the interconnects 32 provides a significant reduction of the parasitic capacitances in the circuit 12. A metallized ground plane and a series of backside connector pads (not shown) typically would be provided on the underside of the lower layer 24 to provide interconnection to other circuits, such as the next circuit in the transceiver.

For the phased array transceiver being discussed herein, a transmitter and receiver scan angle of at least ±60° is desirable. In order to provide the desired scan angle, the dimensions of the layers 22 and 24 are typically provided relative to the frequency band used by the transceiver circuit 12, where each side of the layers 22 and 24 is about λ/2. Several of the various circuit components, such as the amplifiers 14, are not scaleable in that they generally have relatively the same size regardless of the frequency band used by the transceiver circuit 12. Thus, for lower frequency bands, such as 1 GHz, the size of the layers 22 and 24 will be larger, where more circuit components can be fit on a single semiconductor layer. Therefore, if the size of the largest circuit component, here the amplifiers 14, are sufficiently small enough, more components can fit on a single semiconductor layer, where the dimensions of the layers 22 and 24 are set by the frequency used by the transceiver circuit 12.

A metal ring 40 deposited on the layer 22 and a metal ring 42 deposited on the layer 24 hermetically seal the layers 22 and 24. In one embodiment, the rings 40 and 42 are a relatively thick layer of gold and a relatively thin layer of indium, where the indium is deposited on the top of the gold and acts as a catalyst under heat to bond the rings 40 and 42 together to provide a hermetic seal of the cavity 26 with the circuit components therein.

The packaging process of the invention facilitates the use of different semiconductor materials for the different semiconductor layers. Particularly, the semiconductor layers 22 and 24 can be any suitable semiconductor material for integrated circuits, such as silicon, gallium arsenide, indium phosphide, etc. For example, indium phosphide heterojunction bipolar transistors (HBTs) are known for high efficiency power amplifiers and gallium arsenide high electron mobility transistors (HEMPTs) are known for low noise amplifier applications. As discussed herein, it is the semiconductor layer on which the circuit is integrated that is used to provide the hermetic packaging. Thus, the size and weight of the packaging assembly can be reduced over the packaging assemblies known in the art. In one embodiment, the weight of the packaging assembly 10 can be on the order of 0.4 grams for the application being discussed herein.

FIG. 2 is a blown-apart perspective view of an integrated packaging assembly 50 for an MMIC transceiver circuit 52 where like circuit components to the packaging assembly 10 and the transceiver circuit 12 are identified by the same reference numeral. In this embodiment, the frequency band of the transceiver circuit 52 is higher than that used by the transceiver circuit 12, and thus the side dimensions of the semiconductor layers are less than the semiconductor layers 22 and 24. The size of the largest component in the circuit 52, power amplifiers 54, are only slightly less than half the wavelength of the frequency band used by the transceiver circuit 52. Therefore, all of the components of the transceiver circuit 52 cannot be positioned on the same semiconductor layer. Thus, the packaging assembly 50 includes three layers, including the layer 22, and semiconductor layers 56 and 58. The power amplifiers 54 are positioned in a cavity 60 between the upper layer 22 and the middle layer 56, and the rest of the circuit components are positioned in a cavity 62 between the layers 56 and 58. A metal ring 64 and the metal ring 40 hermetically seal the layer 56 to the layer 22 and metal rings 66 and 68 hermetically seal the layer 58 to the layer 56.

FIG. 3 is a blown-apart perspective view of an integrated packaging assembly 70 for an MMIC transceiver circuit 72 where like circuit components to the packaging assembly 50 and the transceiver circuit 52 are identified by the same reference numeral, according to another embodiment of the present invention. The transceiver circuit 72 uses a very high frequency band, possibly in the 80-90 GHz range. Therefore, the antennas can be quite small. In this embodiment, the layer 22 is replaced with a semiconductor layer 72 that includes four patch antennas 74 provided in a sub-array. The amplifiers may be slightly smaller in this application, but the number of amplifiers increases so that only power amplifiers 76 will fit on a middle semiconductor layer 78, requiring a third semiconductor layer 80. Metal sealing rings 82 and 84 hermetically seal the layers 72 and 78 together and metal rings 86 and 88 hermetically seal the layers 78 and 80 together.

The number of semiconductor layers for a particular transceiver circuit depends on many factors, such as the desired functionality, the allocated spacing, the physical size of the circuit components, the interconnect routing, performance specifications and isolation between components. As discussed above, each separate semiconductor layer can be integrated with different circuit components, and can be made of a different semiconductor material so that the circuit design packaging can be made as small and lightweight as possible.

FIG. 4 is a blown-apart perspective view of an integrated packaging assembly 90 for an MMIC transceiver circuit 92, according to another embodiment of the present invention. In this embodiment, the transceiver circuit 92 includes a high directivity, wideband edge radiating antenna element 94. Suitable edge radiating antenna elements for this purpose include Vivaldi antenna elements and notch antenna elements, although other antennas may be also applicable. The packaging assembly 90 includes an upper semiconductor layer 96 and a lower semiconductor layer 98. The various electrical components in the transceiver circuit 92 are shown as power amplifiers 100, phase shifters 102 and a digital controller 106 integrated within a cavity 116 between the semiconductor layers 96 and 98. Interconnection elements 108 couple the circuit components together and circuit components (not shown) on an underside of the layer 96. In this embodiment, the frequency band used by the circuit 92 requires that the size of the largest component in the transceiver circuit 92 be below one-half the wavelength of the frequency band. Thus, all of the components in the transceiver circuit 92 can be positioned on a single semiconductor layer, here layer 98. As above, metal rings 110 and 112, typically indium and gold, are used to hermetically seal the layers 96 and 98 together as discussed above.

FIG. 5 is a blown-apart perspective view of an integrated packaging assembly 120 for an MMIC transceiver circuit 122, where like elements to the packaging assembly 90 are identified by the same reference numeral. In this embodiment, the lower layer 98 is replaced with a middle semiconductor layer 124 and a lower semiconductor layer 126. This is to accommodate the frequency used by the transceiver circuit 122, where the largest circuit component for that frequency band used by the transceiver circuit 122 does not allow all of the circuit components to be on a single layer. Metal sealing rings 128 and 130 seal the layer 124 to the layer 96, and metal sealing rings 132 and 134 seal the layer 126 to the layer 124.

FIG. 6 is a perspective view of a transceiver array 140 of stacked packaging assemblies 142 of the type shown in FIG. 1 to provide multiple interconnected MMIC transceiver circuits. This type of distributed approach can be used to feed vertical stacked packaging assemblies. In this embodiment, there are three packaging assemblies 142. However, this is merely representative as any suitable number of packaging assemblies 142 can be used for a particular application. A feed 144 extends through the packaging assemblies 142 and is electrically coupled to patch connectors 146 therein to electrically couple the transceiver circuits.

FIG. 7 is a perspective view of a transceiver array 150 including packaging assemblies 152 of the type shown in FIG. 4 in a side-to-side configuration to provide multiple interconnected MMIC transceiver circuits. In this embodiment, there are four packaging assemblies 152. However, this is merely representative as any suitable number of packaging assemblies 152 can be used for a particular application.

Figure 8:
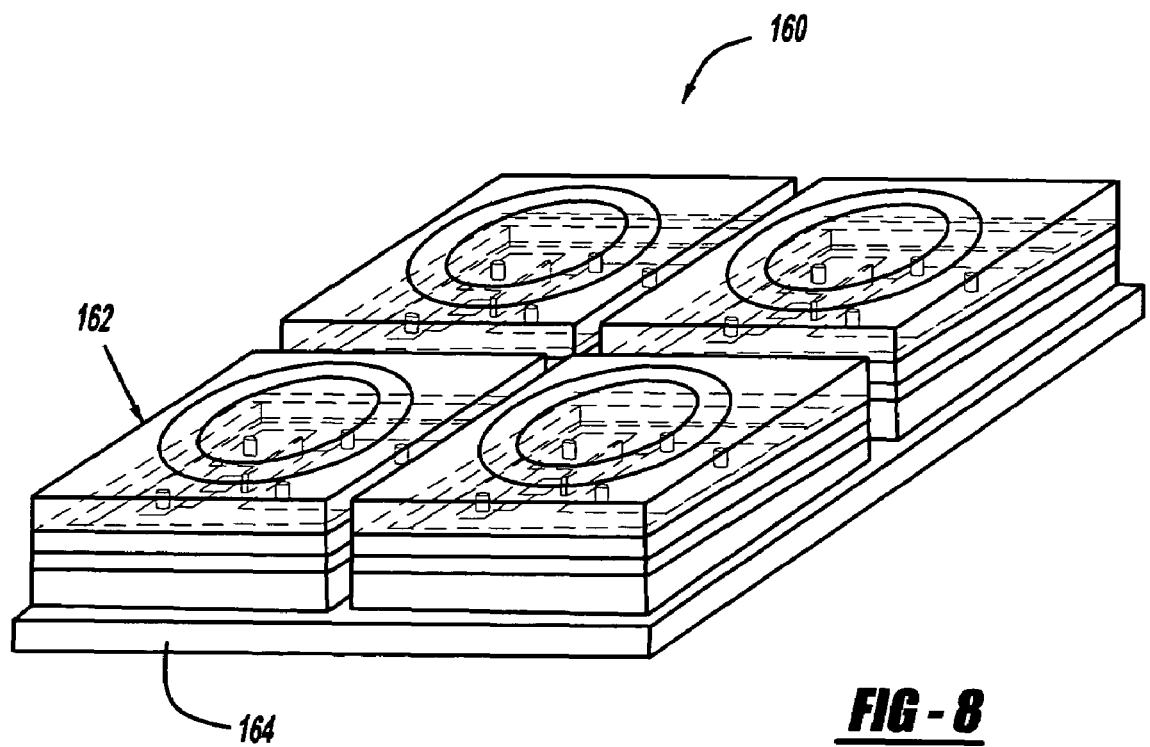
FIG. 8 is a perspective view of an array of packaging assemblies of the type shown in shown in FIG. 1, according to another embodiment of the present invention.

FIG. 8 is a perspective view a transceiver array 160 including side-by-side packaging assemblies 162 of the type shown in FIG. 1 to provide multiple interconnected MMIC transceiver circuits. In this embodiment, there are four packaging assemblies 162. However, this is merely representative as any suitable number of packaging assemblies 162 can be used for a particular application. The packaging assemblies 162 are mounted to a common motherboard 164 to provide a large-scale array integration of the transceiver circuits. Because the array antenna gain is equal to element patterns multiplied by the array pattern, a single radiator can be chosen so that higher directivity can be achieved.

Figure 9:
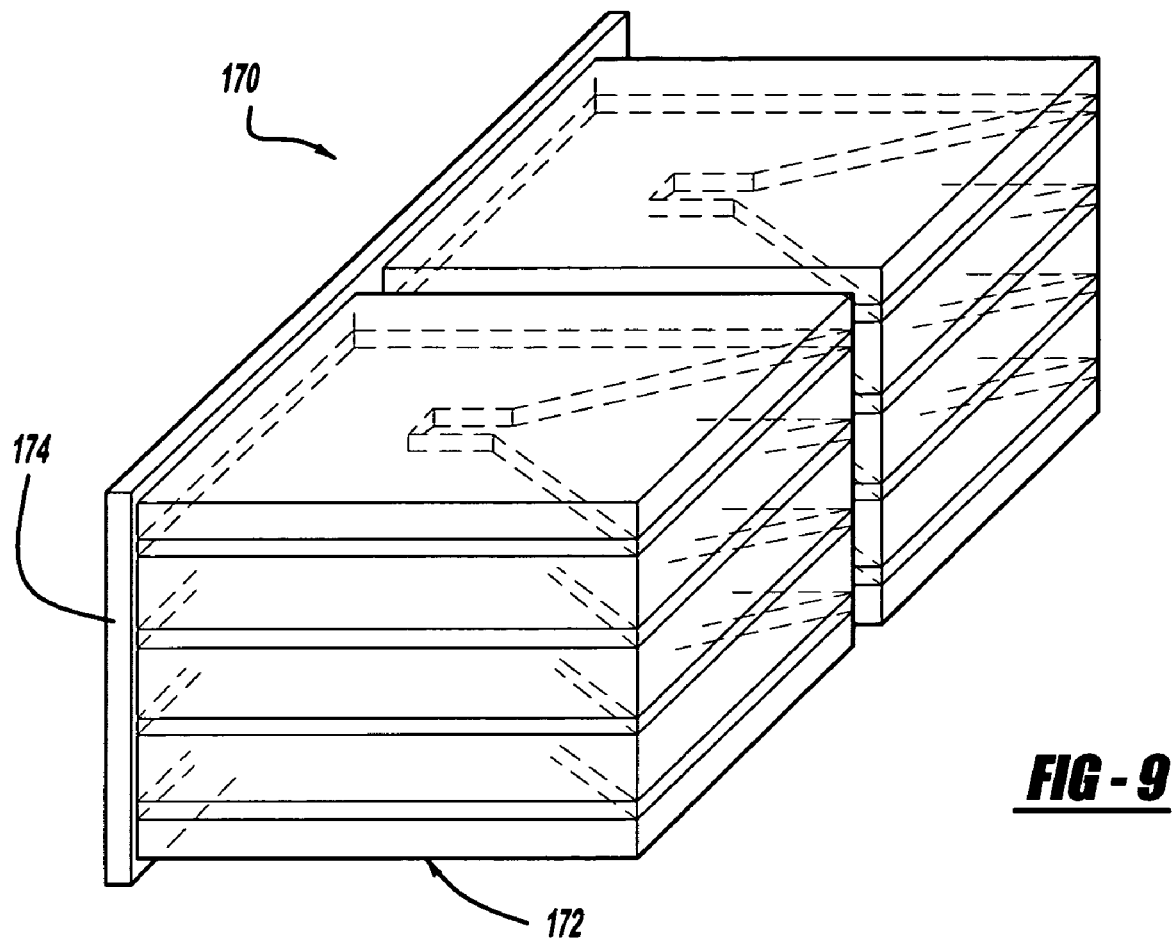
FIG. 9 is a perspective view of a stacked array of packaging assemblies of the type shown in FIG. 4.

FIG. 9 is a perspective view of a transceiver array 170 including packaging assemblies 172 of the type shown in FIGS. 4 and 5 in a side-to-side and stacked configuration to provide multiple interconnected MMIC transceiver circuits. In this embodiment, there are eight packaging assemblies 172. However, this is merely representative as any suitable number of packaging assemblies 172 can be used for a particular application. The packaging assemblies 172 are mounted to a common motherboard 174 to provide a large-scale array integration of the transceiver circuits.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A packaging assembly for an integrated circuit, said assembly comprising:
   a first semiconductor layer and a second semiconductor layer defining a first cavity therebetween;
   a first sealing ring extending around the first cavity and sealing the first semiconductor layer to the second semiconductor layer so as to hermetically seal the first cavity; and
   a plurality of circuit components electrically coupled together within the first cavity, wherein the first and second semiconductor layers are portions of semiconductor wafers on which the plurality of circuit components are fabricated so that the plurality of circuit components are hermetically sealed and packaged by the first sealing ring and the portions of the semiconductor wafers on which the circuit components were fabricated.

2. The assembly according to claim 1 further comprising a patch antenna element deposited on an outside surface of the first semiconductor layer.

3. The assembly according to claim 1 further comprising a side radiating antenna element fabricated within the cavity.

4. The assembly according to claim 1 wherein the sealing ring is a conductive metal sealing ring.

5. The assembly according to claim 4 wherein the sealing ring is a combination of gold and indium.

6. The assembly according to claim 1 further comprising a third semiconductor layer and a second sealing ring, said third semiconductor layer and said second semiconductor layer defining a second cavity therebetween including electrical components of the circuit mounted therein, wherein the second sealing ring seals the third semiconductor layer to the second semiconductor layer so that the electrical components are hermetically sealed within the second cavity.

7. The assembly according to claim 1 wherein the first and second semiconductor layers are part of a plurality of semiconductor layers whose number is defined by the size of the components in the circuit.

8. The assembly according to claim 1 wherein the circuit is a transceiver circuit that is part of an antenna front end.

9. The assembly according to claim 8 wherein the side dimension of the first and second semiconductor layers are about one-half of the wavelength of a frequency band used by the transceiver circuit, and wherein the transceiver circuit provides about a ±60° scan angle.

10. The assembly according to claim 1 wherein the plurality of electrical components include power amplifiers, low noise amplifiers, phase shifters and digital controllers.

11. The assembly according to claim 1 wherein the semiconductor material of the first semiconductor layer is different than the semiconductor material of the second semiconductor layer.

12. The assembly according to claim 1 wherein the semiconductor material of the first and second semiconductor layers is selected from the group consisting of silicon, gallium arsenide and indium phosphide.

13. A packaging assembly for one or more integrated circuits, said assembly comprising:

a plurality of semiconductor layers;

a plurality of circuit components fabricated on the semiconductor layers where circuit components are positioned within cavities between the semiconductor layers, said semiconductor layers being sealed together so that the circuit components within the cavities are hermetically isolated from the environment, wherein at least two of the plurality of semiconductor layers are made of different semiconductor materials; and an antenna element formed on an outside surface of the semiconductor layers.

14. The assembly according to claim 13 wherein the number of semiconductor layers is defined by the size of the components in the circuit, spacing between components in the circuit and a frequency band used by the circuit.

15. A phased antenna array including a plurality of antennas and a plurality of transceiver circuits where a separate antenna is provided for each transceiver circuit, each transceiver circuit and antenna being part of an integrated packaging assembly, where each packaging assembly comprises:

a first semiconductor layer and a second semiconductor layer defining a first cavity therebetween;

a first sealing ring extending around the first cavity and sealing the first layer to the second layer so as to hermetically seal the first cavity; and a plurality of circuit components electrically coupled together within the first cavity, said antenna being deposited on an outside surface of the first or second semiconductor layer, wherein the first and second semiconductor layers are portions of semiconductor wafers on which the plurality of circuit components are fabricated.

16. The antenna array according to claim 15 wherein the side dimension of the first and second semiconductor layers is about one-half the wavelength of the frequency band used by the transceiver circuit so as provide a scan angle of about ±60°.

17. The antenna array according to claim 15 wherein the first sealing ring is a conductive metal sealing ring.

18. The antenna array according to claim 17 wherein the first sealing ring is a combination of gold and indium.

19. The antenna array according to claim 15 further comprising a third semiconductor layer and a second sealing ring, said third semiconductor layer and said second semiconductor layer defining a second cavity therebetween including electrical components of the circuit mounted therein, wherein the second sealing ring seals the third semiconductor layer to the second semiconductor layer so that the electrical components are hermetically sealed within the second cavity.

20. The antenna array according to claim 15 wherein the plurality of electrical components include power amplifiers, low noise amplifiers, phase shifters and digital controllers.

21. The antenna array according to claim 15 wherein the semiconductor material of the first semiconductor layer is different than the semiconductor material of the second semiconductor layer.

22. A packaging assembly for an integrated circuit, said assembly comprising:

a first semiconductor layer and a second semiconductor layer defining a first cavity therebetween;

a first sealing ring extending around the first cavity and sealing the first semiconductor layer to the second semiconductor layer so as to hermetically seal the first cavity;

a plurality of circuit components electrically coupled together within the first cavity, wherein the first and second semiconductor layers are portions of semiconductor wafers on which the plurality of circuit components are fabricated; and a patch antenna element deposited on an outside surface of the first semiconductor layer.

* * * * *